Figure 1:
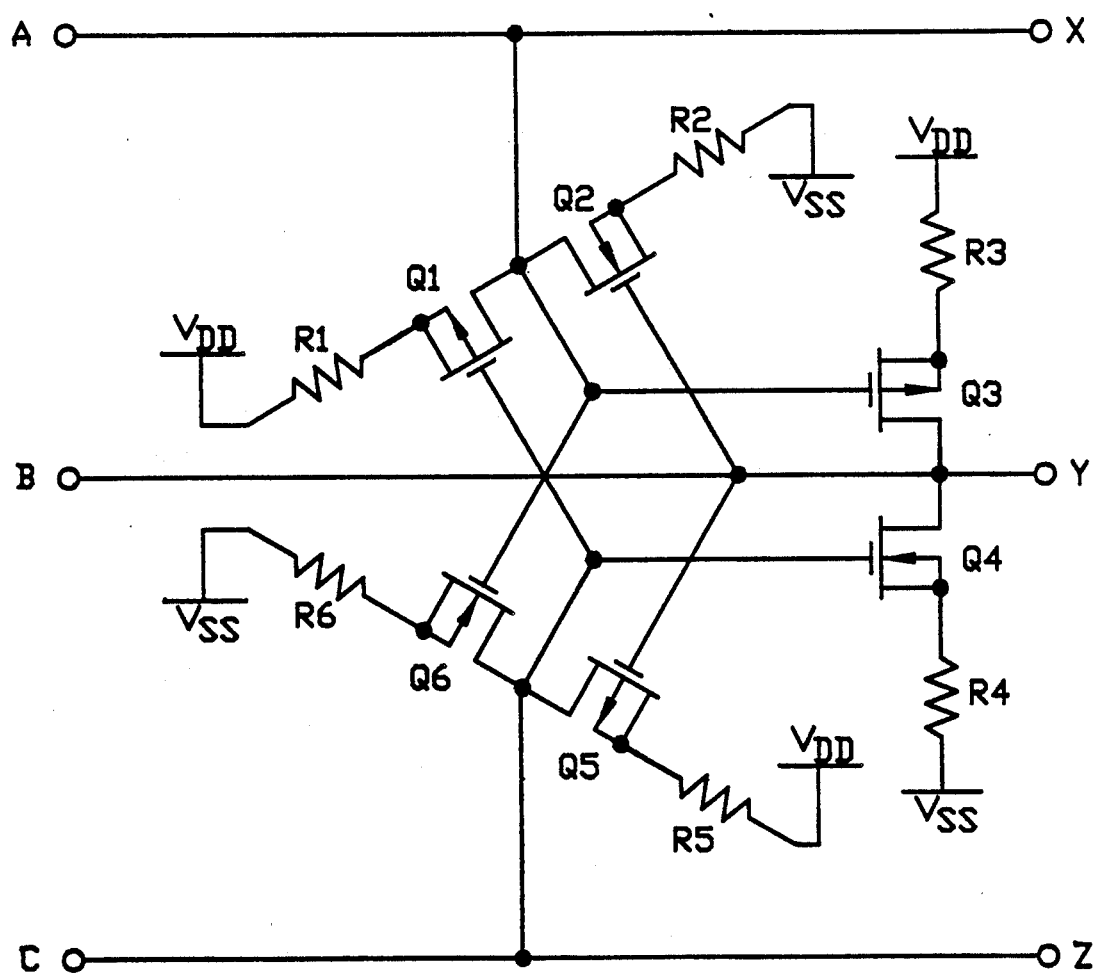

United States Patent [19]

Olson

[11] Patent Number: 4,990,796

[45] Date of Patent: Feb. 5, 1991

[54] TRISTABLE MULTIVIBRATOR

[76] Inventor: Edgar D. Olson, 2020 Artesia Blvd. #25, Redondo Beach, Calif. 90278

[21] Appl. No.: 347,080

[22] Filed: May 3, 1989

[51] Int. Cl.[5] .................. H03K 3/353; H03K 21/00; H03K 23/60; H03K 23/64

[52] U.S. Cl. ............................. 307/279; 307/473; 307/288; 377/98; 377/121; 377/114

[58] Field of Search ............. 307/279, 289, 291, 473, 307/288; 377/118, 121, 123, 125, 126, 98, 114

[56] References Cited

U.S. PATENT DOCUMENTS

| | | | |
|---|---|---|---|
| 3,129,340 | 4/1964 | Baskin | 377/98 |
| 3,283,256 | 11/1966 | Hurowitz | 377/98 |
| 3,492,496 | 1/1970 | Callan | 307/473 |
| 3,508,033 | 4/1970 | Turecki | 377/98 |
| 3,671,764 | 6/1972 | Maley et al. | 307/473 |
| 4,217,502 | 8/1980 | Suzuki et al. | 307/473 |
| 4,302,690 | 11/1981 | Gollinger et al. | 307/473 |

*Primary Examiner*—John Zazworsky
*Attorney, Agent, or Firm*—Andrew Jordan

[57] ABSTRACT

Disclosed is a circuit which provides the controlled generation of tri-level digital signals utilizing Field Effect Transistors (FETs), as active elements. The stability of all three states is due to a unique feed-back technique, and utilization of the gate threshold characteristics of FETs. This circuit is controllable with either bi-level or tri-level digital signals, and is externally configurable as: a ternary up counter, providing the count sequence of 0,1,2,0 ... ; a ternary down counter, providing the count sequence of 2,1,0,2 ... ; a ternary shift left/right register; or as a ternary memory.

19 Claims, 3 Drawing Sheets

TRISTABLE MULTIVIBRATOR

BACKGROUND

1. Field of Invention

This invention relates to multivalued switching circuits, and specifically to the controlled generation of tri-level digital signals.

2. Description of Prior Art

The controlled generation, manipulation, and interpretable transmission of tri-level signals are requisites, which must be met in a cost effective manner, to realize a ternary computer.

Heretofore, development of a ternary computer has addressed the manipulation aspect of a computer by providing the connective circuits necessary to synthesize ternary logic. However, these connective circuits meet only the manipulation and interpretible transmission requirements of a ternary computer. The requisite yet to be met is the controlled generation of tri-level signals.

While there are several known types of n-stable multivibrators, their outputs are bi-level, or binary. Because their outputs are binary, they do not meet the requirement of controlled generation of tri-level signals. To be of use in a ternary computer, the outputs of previously available n-stable multivibrators would require translative circuitry. This translative circuitry inordinately increases the size and incumbers the cost of these multivibrators. Also, the manufacturing difficulties, and unproven reliability of ternary switches precluded their use.

OBJECTS AND ADVANTAGES

The ultimate object of the present invention is to make the further development of a ternary computer more attractive by providing a previously missing device necessary to the realization of a ternary computer.

The specific object of the present invention is the development of a circuit which realizes the controlled generation of tri-level digital signals employing only binary switches. Due to their low cost, availability, and high reliability enhancement mode Insulated Gate Field Effect Transistors have been selected to achieve this end.

An advantage of the present invention is that it avoids costly translative circuitry necessary to previous n-stable multivibrators by producing tri-level signals directly, and will operate with a single bipolar power supply.

Another advantage is that this invention is producible with current integration and manufacturing technologies.

Yet another advantage and a feature of this invention is that the control circuitry, which previously required development by users, has been included.

Another feature of the present invention is that it may be externally configured as a ternary up counter, a ternary down counter, a ternary shift register, or a ternary memory.

These and other objects, advantages, and features will become apparent from the following detailed discussion of operation, and the figures which illustrate this invention.

DRAWING FIGURES

1. FIG. 1 shows the schematic diagram of an embodiment of the tristable multivibrator circuit of the present invention.

Figure 2:
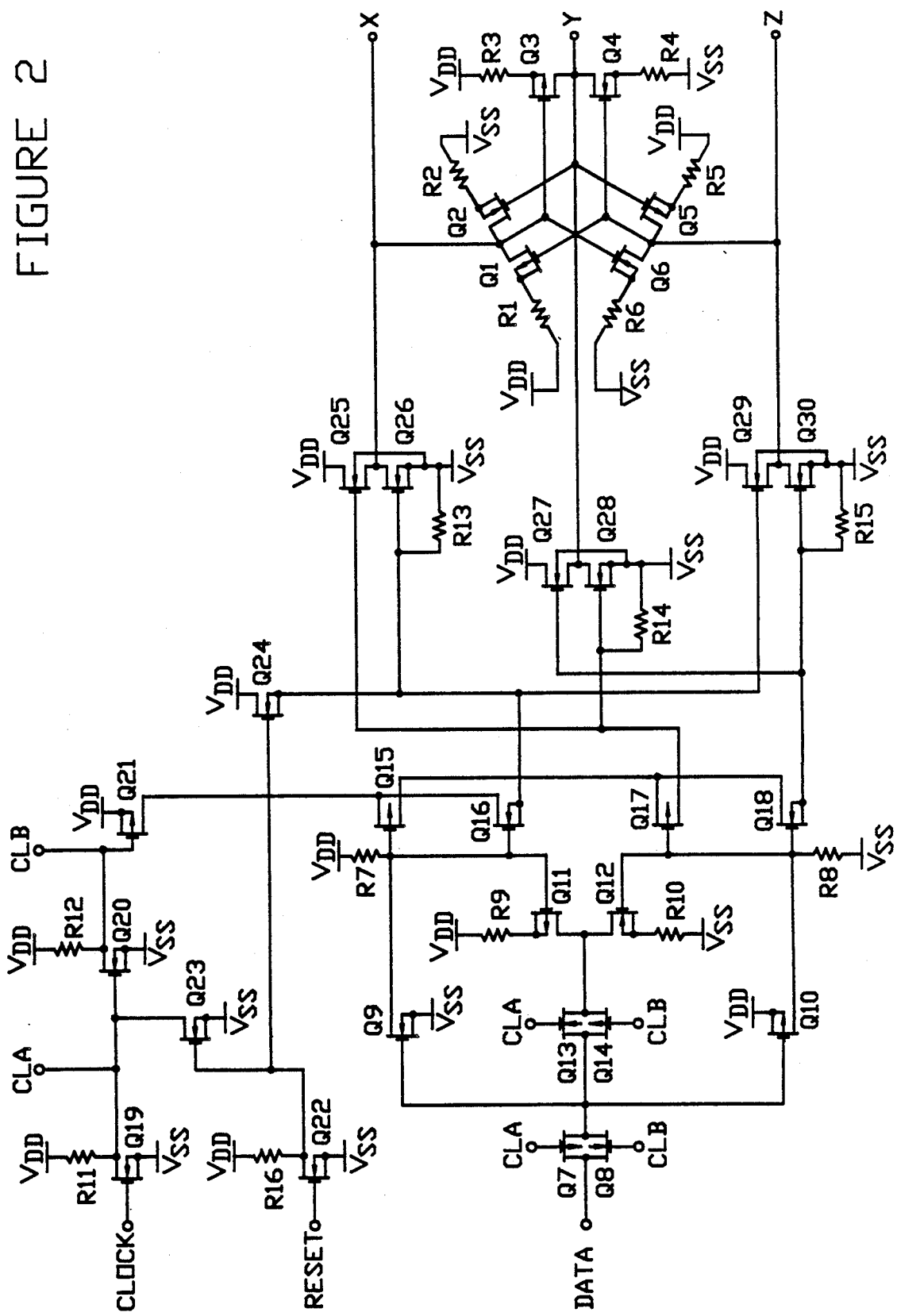

2. FIG. 2 shows the schematic diagram of a tristable multivibrator, with the associated control circuitry necessary to form a one ternary digit data register. (For clarity of the drawing, the substrate or bulk connections of Q7, Q8, Q13, Q14, Q15, and Q17 are not shown. However, the substrates of Q7, Q14, Q15, and Q17 are connected to $V_{DD}$, and the substrates of Q8, and Q13 are connected to $V_{SS}$.)

Figure 3:
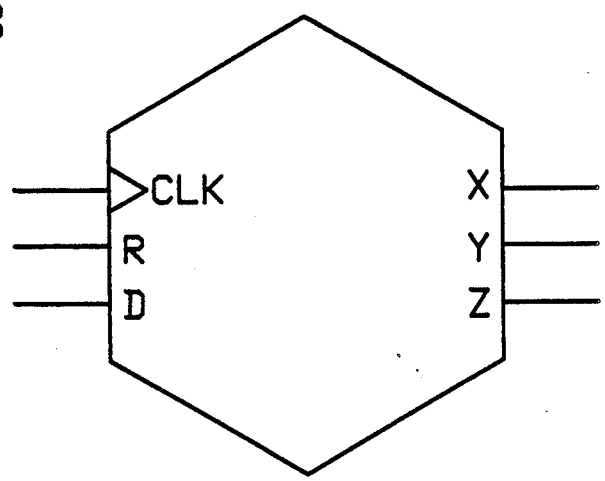

3. FIG. 3 shows a drawing representative of the ternary data register of FIG. 2, and is used to simplify schematic diagrams which include a ternary data register.

Figure 4:
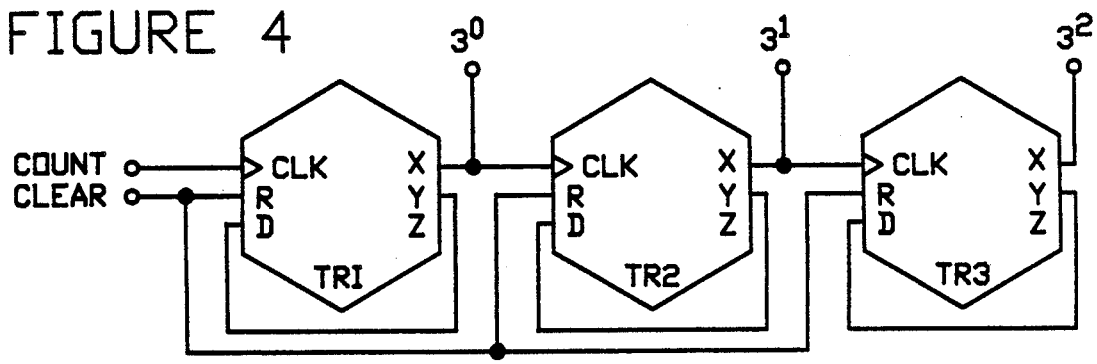

4. FIG. 4, shows the schematic diagram of three ternary data registers, connected to form a three ternary digit up counter.

Figure 5:
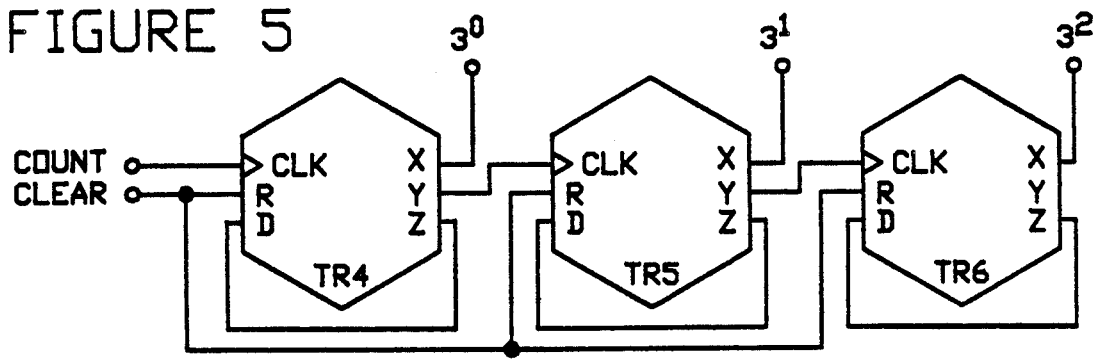

5. FIG. 5, shows the schematic diagram of three ternary data registers, connected to form a three ternary digit down counter.

OPERATION OF INVENTION

In the following discussions the active elements are enhancement mode Insulated Gate Field Effect Transistors, (IGFETs), and have a $V_{GS(threshold)}$ of +2 volts for the N channel devices, and −2 volts for the P channel devices. The terms "on" and "off", indicate transistors in the states of conduction and non-conduction, respectively. The value of $V_{DD}-V_{SS}$ is 6 Volts. And of primary importance to circuit operation, the value $V_{EE}=(V_{DD}-V_{SS})/2$, and must exceed the $V_{GS(threshold)}$ of both N channel and P channel IGFETs employed. Also the correspondence of digital values to electrical values to reference designation obtains:

| Digital value | Electrical value | Reference designation |
|---|---|---|
| 0 | 0 Volts | $V_{SS}$ |
| 1 | 3 Volts | $V_{EE}$ |
| 2 | 6 Volts | $V_{DD}$ |

Operation/Tristable multivibrator:

Referring now to FIG. 1, there is shown an embodiment of a tristable multivibrator.

The tristable multivibrator of the present invention consists of three feed-back controlled voltage dividers. The mid-point of each voltage divider is connected to an input terminal, an output terminal, and the gate of one transistor in each of the other two voltage dividers. The input terminals are labeled A, B, and C. The output terminals are labeled X, Y, and Z, and the three voltage dividers are hereafter referred to by their output terminal label.

The X output is the primary output, and the value sampled at this point indicates the current state of the tristable multivibrator. Supplementary to the X output are the Y, and Z outputs. The X output level is produced by the X voltage divider, comprised of R1, Q1, Q2, and R2. The Y output level is produced by the Y voltage divider, comprised of R3, Q3, Q4, and R4. The Z output level is produced by the Z voltage divider, comprised of R5, Q5, Q6, and R6. The X output is fed-back to the gate of Q3 in the Y voltage divider, and to the gate of Q6 in the Z voltage divider. The Y output is fed-back to the gate of Q2 in the X voltage divider, and to the gate of Q5 in the Z voltage divider. The Z output is fed-back to the gate of Q1 in the X voltage divider, and to the gate of Q4 in the Y voltage divider.

Stability of all three states is attributed to two factors: (1) regenerative switching through the feed-back technique employed, and (2) $V_{EE}$ is of sufficient potential to bias both N channel and P channel devices into conduction. The correspondence of the three states to the output digital values obtains:

|       | Outputs |   |   |
| State | X | Y | Z |
|---|---|---|---|
| 1 | 0 | 1 | 2 |
| 2 | 1 | 2 | 0 |
| 3 | 2 | 0 | 1 |

These output levels, and their stability, will become obvious from the following three state descriptions.

State description 1:

The tristable multivibrator is placed in state 1 when input terminals A and C, are momentarily connected the potentials $V_{SS}$ and $V_{DD}$, respectively. This causes the X output level to become $V_{SS}$ or digital 0, and the Z output level to become $V_{DD}$ or digital 2. The X output level of $V_{SS}$ causes Q3 to turn on and Q6 to turn off. The Z output level of $V_{DD}$ causes Q1 to turn off and Q4 to turn on. With both Q3 and Q4 conducting in the Y voltage divider, the Y output level is $V_{EE}$ or digital 1. The Y output level of $V_{EE}$ causes Q2 and Q5 to turn on. And the digital output states of X=0, Y=1, and Z=2 remain stable, due to regenerative switching through the feed-back network.

State description 2:

The tristable multivibrator is placed in state 2 when input terminals C and B, are momentarily connected the potentials $V_{SS}$ and $V_{DD}$, respectively. This causes the Y output level to become $V_{DD}$ or digital 2, and the Z output level to become $V_{SS}$ or digital 0. The Y output level of $V_{DD}$ causes Q2 to turn on and Q5 to turn off. The Z output level of $V_{SS}$ causes Q1 to turn on and Q4 to turn off. With both Q1 and Q2 conducting in the X voltage divider, the X output level is $V_{EE}$ or digital 1. The X output level of $V_{EE}$ causes Q3 and Q6 to turn on. And the digital output states of X=1, Y=2, and Z=0 remain stable, due to regenerative switching through the feed-back network.

State description 3:

The tristable multivibrator is placed in state 3 when input terminals B and A, are momentarily connected the potentials $V_{SS}$ and $V_{DD}$, respectively. This causes the X output level to become $V_{DD}$ or digital 2, and the Y output level to become $V_{SS}$ or digital 0. The X output level of $V_{DD}$ causes Q3 to turn off and Q6 to turn on. The Y output level of $V_{SS}$ causes Q2 to turn off and Q5 to turn on. With both Q5 and Q6 conducting in the Z voltage divider, the Z output level is $V_{EE}$ or digital 1. The Z output level of $V_{EE}$ causes Q1 and Q4 to turn on. And the digital output states of X=2, Y=0, and Z=1 remain stable, due to regenerative switching through the feed-back network.

Operation/Control Circuitry/General:

Referring now to FIG. 2, shown there is the schematic diagram of a tristable multivibrator, with the control circuitry necessary to form a one ternary digit data register. (For clarity of the drawing, the substrate or bulk connections of Q7, Q8, Q13, Q14, Q15, and Q17 are not shown. However, the substrates of Q7, Q14, Q15, and Q17 are connected to $V_{DD}$, and the substrates of Q8, and Q13 are connected to $V_{SS}$.) The input terminals are labeled DATA, CLOCK, and RESET. The DATA input terminal is the point where data is presented to the circuit. The CLOCK input terminal is the point where the signal which controls the loading of data, into the tristable multivibrator, is presented. The RESET input terminal is the point where the control signal, that places the outputs in the known states of X=0, Y=1, and Z=2, is presented. The clock and reset functions become active during the 1 to 0 transition of the digital value presented to the respective input terminal.

Operation/Control circuitry/Reset function:

The reset function becomes active during the 1 to 0 transition of the digital value presented to the RESET input terminal. When this function is active, Q22 is biased to turn off. The gates of Q23 and Q24 are held at potential $V_{DD}$ through R16, causing Q23 and Q24 to turn on. Point CLA is held at potential $V_{SS}$ through Q23, causing any clock activity to be terminated or prevented. The gates of Q26 and Q29 are held at potential $V_{DD}$ through Q24, causing Q26 and Q29 to turn on. The X output is held at potential $V_{SS}$ through Q26, and the Z output is held at potential $V_{DD}$ through Q29. The switching of state description 1 occurs, and the outputs are in the states of X=0, Y=1, and Z=2.

The reset function becomes inactive during the 0 to 1 transition of the digital value presented to the RESET input terminal. When this function is inactive, Q22 is conducting. The gates of Q23 and Q24 are held at potential $V_{SS}$ through Q22, causing Q23 and Q24 to turn off. The gates of Q26 and Q29 are held at potential $V_{SS}$ through R13, causing Q26 and Q29 to turn off. And the outputs remain in the digital states of X=0, Y=1, and Z=2.

Operation/Control circuitry/Clock function:

The clock function is inactive while the digital value presented to the CLOCK input terminal is 1 or 2. While the clock function is inactive, Q19 conducts. Point CLA and the gate of Q20, are held at potential $V_{SS}$ through Q19, causing Q20 to turn off. Point CLB and the gate of Q21, are held at potential $V_{DD}$ through R12, causing Q21 to turn off. With points CLA and CLB at the potentials of $V_{SS}$ and $V_{DD}$ respectively, the transmission gate comprised of Q7 and Q8 is conducting, and the transmission gate comprised of Q13 and Q14 is not conducting.

The clock function becomes active during the 1 to 0 transition of the digital value presented to the CLOCK input terminal. While the clock function is active, Q19 is not conducting. Point CLA and the gate of Q20, are held at potential $V_{DD}$ through R11, causing Q20 to turn on. Point CLB and the gate of Q21, are held at potential $V_{SS}$ through Q20, causing Q21 to turn on. With points CLA and CLB at the potentials of $V_{DD}$ and $V_{SS}$ respectively, the transmission gate comprised of Q7 and Q8 is not conducting, and the transmission gate comprised of Q13 and Q14 is conducting.

While the transmission gate comprised of Q7 and Q8 is conducting, the datum present at the DATA terminal controls the gates of Q9 and Q10. The output of the inverter, comprised of Q9 and R7, controls the gates of Q11, Q15, and Q16. The output of the inverter, comprised of Q10 and R8, controls the gates of Q12, Q17, and Q18.

Operation/Control circuitry/Clock-Data function:

The voltage divider, comprised of R9, Q11, Q12, and R10, is controlled by Q9 and Q10, and its output is equal in value to the datum present at the DATA input terminal. This voltage divider and the transmission gate, comprised of Q13 and Q14, form a feed-back loop when the clock function becomes active. Activation of the clock function causes the transmission gate, comprised of Q7 and Q8 to turn off, and the transmission gate, comprised of Q13 and Q14 to turn on. The feed-back to Q9 and Q10, through Q13 and Q14, forms a latch which holds the value that was present at the DATA input terminal when the clock function became active. This latch prevents loading erroneous values, due to transitions of the value at the DATA input terminal, subsequent to the clock function becoming active.

When the digital value present at the DATA input terminal is 0, Q9 is not conducting, and Q10 is conducting. The gates of Q15 and Q16 held at potential $V_{DD}$ through R7. This biases Q15 to turn off, and Q16 to turn on, when Q21 conducts. When the clock input becomes active the gate of Q21 will be at potential $V_{SS}$ through Q20, causing Q21 to conduct. The gates of Q26 and Q29 are held at potential $V_{DD}$ through Q16 and Q21, causing Q26 and Q29 to turn on. The gates of Q25 and Q28 are held at potential $V_{SS}$ through R14, causing Q25 and Q28 to remain off. The gates of Q27 and Q30 are held at potential $V_{SS}$ through R15, causing Q27 and Q30 to remain off. The X output is held at potential $V_{SS}$ through Q26, and the Z output is held at potential $V_{DD}$ through Q29. The switching of state description 1 occurs, and the output levels become the digital values of $X=0$, $Y=1$, and $Z=2$.

When the digital value present at the DATA input terminal is 1, Q9 and Q10 conduct. The gates of Q15 and Q16 held at potential $V_{SS}$ through Q9, biasing Q15 to turn on, and Q16 to turn off, when Q21 conducts. The gates of Q17 and Q18 are held at potential $V_{DD}$ through Q10, biasing Q17 to turn off, and Q18 to turn on, when Q21 conducts. When the clock input becomes active the gate of Q21 will be at potential $V_{SS}$ through Q20, causing Q21 to conduct. The gates of Q27 and Q30 are held at potential $V_{DD}$ through Q15, Q18 and Q21, causing Q27 and Q30 to turn on. The gates of Q25 and Q28 are held at potential $V_{SS}$ through R14, causing Q25 and Q28 to remain off. The gates of Q26 and Q29 are held at potential $V_{SS}$ through R13, causing Q26 and Q29 to remain off. The Z output is held at potential $V_{SS}$ through Q30, and the Y output is held at potential $V_{DD}$ through Q27. The switching of state description 2 occurs, and the output levels become the digital values of $X=1$, $Y=2$, and $Z=0$.

When the digital value present at the DATA input terminal is 2, Q9 conducts, and Q10 is off. The gates of Q15 and Q16 held at potential $V_{SS}$ through Q9, biasing Q15 to turn off, and Q16 to turn off, when Q21 conducts. The gates of Q17 and Q18 are held at potential $V_{SS}$ through R8, biasing Q17 to turn on, and Q18 to turn off, when Q21 conducts. When the clock input becomes active the gate of Q21 will be at potential $V_{SS}$ through Q20, causing Q21 to conduct. The gates of Q25 and Q28 are held at potential $V_{DD}$ through Q15, Q17 and Q21, causing Q25 and Q28 to turn on. The gates of Q26 and Q29 are held at potential $V_{SS}$ through R13, causing Q26 and Q29 to remain off. The gates of Q27 and Q30 are held at potential $V_{SS}$ through R15, causing Q27 and Q30 to remain off. The X output is held at potential $V_{DD}$ through Q25, and the Y output is held at potential $V_{SS}$ through Q28. The switching of state description 3 occurs, and the output levels become the digital values of $X=2$, $Y=0$, and $Z=1$.

It can be seen from the foregoing that Q15, Q16, Q17, and Q18 work together to comprise a one-of-three signal selector. When the digital value present at the DATA input terminal is 0, Q16 turns on and passes the appropriate signal to selected input drivers of the tristable multivibrator. When the digital value present at the DATA input terminal is 1, Q15 and Q18 turn on. Q18 then passes the appropriate signal to selected input drivers of the tristable multivibrator. When the digital value present at the DATA input terminal is 2, Q15 and Q17 turn on. Q17 then passes the appropriate signal to selected input drivers of the tristable multivibrator. In this manner and through these switches, the tristable multivibrator is signalled according to the digital value present at the DATA input terminal in order to elicit the appropriate output.

Referring now to FIG. 3, there is shown a drawing representative of a one ternary digit data register, and is used as a symbol to simplify schematic diagrams which include a ternary data register. This symbol is utilized in the drawings that illustrate the following discussion of ternary counters.

Ternary Counting

In this discussion of ternary counters, the acronym Tert is used in the stead of "ternary digit", (TERnary digiT). Also, it is assumed that a reset operation has been performed prior to counting, to initialize the value of the X output(s) to 0. Also, the output values in this discussion are digital values.

The function of counting, up or down, is performed when a supplementary output value, Y or Z, is clocked into the ternary data register. This is due to the relationship of the X output to the Y, and Z outputs. These relationships are; $Y=X+1$, and $Z=X-1$. Because of these relationships, a one Tert counter is formed by connecting the Y or Z output to the DATA input.

Ternary counting/Up counting:

A one Tert up counter is formed by connecting the Y output, of a ternary data register, to its DATA input. When clocked, the X output takes the value that was present at the DATA input when the clock input became active. In this case, the value present at the DATA input was that of the Y output, or $X+1$. Therefore, the output values of the ternary data register have been incremented. Successive clocking, results in successive incrementation. When $X=2$, $Y=0$ and when clocked the X value becomes 0, thereby completing the ternary count sequence of 0, 1, 2, and back to 0.

Refering to FIG. 4, there is shown a three Tert up counter, formed by cascading three ternary data registers, configured as up counters, and labeled TR1, TR2, and TR3. Cascading is accomplished by connecting the X output of each ternary data register to the CLOCK input of the next ternary data register, and to an output terminal labeled with the power of 3 represented by each ternary data register. The CLEAR input terminal is the point that is used to present a reset signal to the three Tert up counter by signalling the reset inputs of the ternary data registers. The pulses to be counted are presented to the COUNT input terminal.

When the X output of TR1 or TR2 is incremented from 0 to 1, or from 1 to 2 there is no effect to the subsequent ternary data register. However, when a ternary data register completes the ternary count sequence, (i.e. the 2 to 0 transition of the X output), it provides the subsequent ternary data register with a clock signal. This is, in effect, a carry to the next higher power of 3.

Ternary counting/Down counting:

A one Tert down counter is formed by connecting the Z output, of a ternary data register, to its DATA input. When clocked, the X output takes the value that was present at the DATA input when the clock input became active. In this case, the value present at the DATA input was that of the Z output, or $X-1$. Therefore, the output values of the ternary data register have been decremented. Successive clocking, results in successive decrementation. When $X=1$, $Z=0$ and when clocked the X value becomes 0, thereby completing the ternary down count sequence of 0, 2, 1, and back to 0.

Referring to FIG. 5, there is shown a three Tert down counter, formed by cascading three ternary data registers, configured as down counters, and labeled TR4, TR5, and TR6. Cascading is accomplished by connecting the Y output of each ternary data register to the CLOCK input of the next ternary data register. Also, the X output of each ternary data register is connected to an output terminal, labeled with the power of 3 represented by each ternary data register. The CLEAR input terminal is the point that is used to present a reset signal to the three Tert down counter by signalling the reset inputs of the ternary data registers. The pulses to be counted are presented to the COUNT input terminal.

When the X output of TR4 or TR5 is decremented from 2 to 1, or from 1 to 0 there is no effect to the subsequent ternary data register. However, when a ternary data register begins the ternary down count sequence, (i.e. the 0 to 2 transition of the X output), the transition from 1 to 0 of the Y output provides the subsequent ternary data register with a clock signal. This is, in effect, a borrow from the next higher power of 3.

While the invention has been particularly shown and described with specifics, the reader should not construe these as limitations on the scope of the invention, but merely as an exemplification of a preferred embodiment thereof. Those skilled in the art will envision many other possible variations that are within its scope. For example, skilled artisans will readily be able to change the input level necessary to cause the reset or clock functions to become active. They will also be able to employ alternative active elements, or replace passive devices with active devices. They can add transmission gates to the outputs thereby implementing guad-state or the 4$^{th}$ state of the outputs, or add output buffers to increase the current drive capabilities of the outputs. Hence, various changes in form and details may be made therein without departing from the spirit and scope of the invention.

I claim:

1. The tristable multivibrator as set forth in claim 4, wherein the switching circuitry means connected to the lines comprises:

A tristable multivibrator comprising:
a first input line connected to a first output line;
a second input line connected to a second output line;
a third input line connected to a third output line;
a first switch connected to the first input and output lines on one side, connected to a first resistor in series with and between the first switch and a first source of electric potential on another side, and connected to the third input and output lines such that when the third input line is at an electric potential sufficiently different than that of the first source of electric potential, the first switch turns on and allows transmission of electric potential from the first source of electric potential to the first input and output lines, and vice-versa such that when the third input line is not at an electric potential sufficiently different than that of the first source of electric potential, the first switch turns off and prevents transmission of electric potential from the first source of electric potential to the first input and output lines, thereby controlling transmission of electric potential from the first source of electric potential to the first input and output lines;
a second switch connected to the first input and output lines on one side, connected to a second resistor in series with and between the second switch and a second source of electric potential on another side, and connected to the second input and output lines such that when the second input line is at an electric potential sufficiently different than that of the second source of electric potential, the second switch turns on and allows transmission of electric potential from the second source of electric potential to the first input and output lines, and vice-versa, thereby controlling transmission of electric potential from the second source of electric potential to the first input and output lines;
a third switch connected to the second input and output lines on one side, connected to a third resistor in series with and between the third switch and the first source of electric potential on another side, and connected to the first input and output lines such that when the first input line is at an electric potential sufficiently different than that of the first source of electric potential, the third switch turns on, and vice-versa, thereby controlling transmission of electric potential from the first source of electric potential to the second input and output lines;
a fourth switch connected to the second input and output lines on one side, connected to a fourth resistor in series with and between the fourth switch and the second source of electric potential on another side, and connected to the third input and output lines such that when the third input line is at an electric potential sufficiently different than that of the second source of electric potential, the fourth switch turns on, and vice-versa, thereby controlling transmission of electric potential from the second source of electric potential to the second input and output lines;
a fifth switch connected to the third input and output lines on one side, connected to a fifth resistor in series with and between the fifth switch and the first source of electric potential on another side, and connected to the second input and output lines such that when the second input line is at an electric potential sufficiently different than that of the first source of electric potential, the fifth switch turns on, and vice-versa, thereby controlling transmission of electric potential from the first source of electric potential to the third input and output lines; and
a sixth switch connected to the third input and output lines on one side, connected to a sixth resistor in series with and between the sixth switch and the second source of electric potential on another side, and connected to the first input and output lines such that when the first input line is at an electric potential sufficiently different than that of the second source of electric potential, the sixth switch turns on, and vice-versa, thereby controlling transmission of electric potential from the second source of electric potential to the third input and output lines.

2. The tristable multivibrator as set forth in claim 1, wherein the switches comprise enhancement mode insulated gate field effect transistors;
the first source of electric potential is a source of electric potential at minimally twice an enhancement mode insulated gate field effect transistor's threshold level; and
the second source of electric potential is a source of electric potential at electrical ground.

3. A three-state data register comprising:
clock circuitry means for controlling loading of data into the data register;
reset circuitry means for placing the data register in a known state of output, said reset circuitry means connected to the clock circuitry means; and
data circuitry means for the reception and transmission of data, such that when a data signal is presented to and loaded into the data register, said data signal is maintained and passed on to a primary output and two separate distinct signals are generated as supplementary outputs, said data circuitry means connected to the reset circuitry means and the clock circuitry means.

4. The three-state data register as set forth in claim 3, wherein the clock circuitry means comprises:
an input line for clock signals;
a 1st switch connected to the clock input line that turns off when an appropriate clock circuit activating signal is present on the clock signal input line, and vice-versa;
a 2nd switch connected to the 1st switch that turns on when the 1st switch turns off, and vice-versa;
a 3rd switch connected to the 2nd switch that turns on when the 2nd switch turns on, and vice-versa; and
an output line connected to and leading from the 3rd switch to the data circuitry means.

5. The three-state data register as set forth in claim 3, wherein the reset circuitry means comprises:
an input line for reset signals;
a 1st switch connected to the reset input line that turns off when the appropriate signal is present on the reset input line, and vice-versa;
a 2nd switch connected to the 1st switch that turns on when the 1st switch turns off, and vice-versa, said 2nd switch then passing a signal to the clock circuitry means thereby disabling it and preventing the loading of data into the data register; and
a 3rd switch connected to the 1st switch that turns on when the 1st switch turns off, and vice-versa, said 3rd switch then passing a signal to the data circuitry means, said signal placing the data register in a known state of output.

6. The three-state data register as set forth in claim 3, wherein the data circuitry means comprises:
a data input line;
a first transmission gate connected to the data input line and the clock circuitry means;
a latch connected to the first transmission gate and the clock circuitry means;
a one of three signal selector means for selecting a signal on the latch, connected to the latch and clock circuitry means;
input drivers connected to the one of three signal selector means and the reset circuitry means;
a tristable multivibrator connected to the input drivers; and
output lines for data signals connected to the tristable multivibrator.

7. The data circuitry means as set forth in claim 6, wherein the first transmission gate comprises:
1st and 2nd switches connected on one side to the data input line, on another side to the latch, and on a third side to the clock circuitry means such that when appropriate signals are impressed upon said 1st and 2nd switches by the clock circuitry means, said 1st and 2nd switches are off, and vice-versa, thus controlling transmission of a data signal on the data input line through said 1st and 2nd switches to the latch.

8. The data circuitry means as set forth in claim 6, wherein the latch comprises:
a first inverter;
a second inverter connected to the first inverter;
a voltage divider connected to both the first and second inverters; and
a second transmission gate connected to the first transmission gate and both first and second inverters on one side, the voltage divider on another side, and the clock circuitry means such that when the clock circuitry means impresses an appropriate signal upon said second transmission gate, said second transmission gate turns on and passes signals, and vice-versa, thereby controlling transmission of signals from the voltage divider to the first and second inverters, said signals impressed upon said second transmission gate by the voltage divider and passed by said second transmission gate maintaining signals in the latch originally passed to the latch by the first transmission gate.

9. The latch as set forth in claim 8, wherein the first inverter comprises a 1st switch that turns on and passes a low signal when a high or intermediate signal is impressed upon it and that turns off when a low signal is impressed upon it and wherein the second inverter comprises a 2nd switch that turns on and passes a high signal when a low or intermediate signal is impressed upon it, and that turns off when a high signal is impressed upon it.

10. The latch as set forth in claim 8, wherein the voltage divider comprises:
a 1st switch connected to the first inverter and the second transmission gate such that when an appropriate signal is impressed upon said 11th switch by the first inverter, said 1st switch turns off, and vice-versa, thereby controlling the transmission of a signal through said 1st switch to the second transmission gate;
a 2nd switch connected to the 1st switch, the second transmission gate, and the second inverter such that when an appropriate signal is impressed upon said 2nd switch by the second inverter, said 2nd switch turns on, and vice-versa, thereby controlling the transmission of a signal through said 2nd switch to the second transmission gate.

11. The latch as set forth in claim 8, wherein the second transmission gate comprises:

1st and 2nd switches connected to the voltage divider, the 1st and 2nd inverters, and the clock circuitry means such that when appropriate signals are impressed upon said 1st and 2nd switches by the clock circuitry means, said 1st and 2nd switches are on, and vice-versa, thereby controlling the further transmission to the first and second inverters of a signal impressed upon said 1st and 2nd switches by the voltage divider.

12. The one of three signal selector means as set forth in claim 6, wherein the signal selector means comprises:
   a 1st switch connected to the latch, the signal selector means, and input drivers of the tristable multivibrator such that when the latch impresses an appropriate signal upon said 1st switch, said 1st switch turns on, and vice-versa, thereby controlling the further transmission of a signal from the signal selector means to input drivers of the tristable multivibrator;
   a 2nd switch connected to the latch, the signal selector means, and input drivers of the tristable multivibrator such that said 2nd switch turns on when an appropriate signal is impressed upon it by the latch, and vice-versa, thereby controlling further transmission of a signal from the signal selector means to input drivers of the tristable multivibrator;
   a 3rd switch connected to the latch, the clock circuitry means, and input drivers of the tristable multivibrator such that said 3rd switch turns on in response to an appropriate signal impressed upon it by the latch, and vice-versa, thereby controlling further transmission of a signal from the clock circuitry means to input drivers of the tristable multivibrator; and
   a 4th switch connected to the latch, the clock circuitry means and the 2nd and 1st switches such that when an appropriate signal is impressed upon said 4th switch by the latch, said 4th switch turns on, and vice-versa, thereby controlling the further transmission of a signal from the clock circuitry means to the 2nd and 1st switches.

13. The data circuitry means as set forth in claim 6, wherein the input drivers for inputs to the tristable multivibrator each comprises:
   a first switch capable of transmitting a high signal; and
   a second switch connected to the first switch and capable of transmitting a low signal; where
   a separate input driver is connected to each input line of the tristable multivibrator.

14. The data circuitry means as set forth in claim 6, wherein the input drivers for inputs to the tristable multivibrator comprise:
   a 1st switch connected to a first tristable multivibrator input and the one of three signal selector means, said 1st switch allowing transmission of a high signal to the first input line when it is on, and vice-versa, said 1st switch turning on and off in response to appropriate signals from the one of three signal selector means;
   a 2nd switch connected to the 1st switch, the one of three signal selector means, the reset circuitry means, and the first tristable multivibrator input, said 2nd switch allowing transmission of a low signal to the first input line when it is on, and vice-versa, said 2nd switch turning on and off in response to appropriate signals from the one of three signal selector means or the reset circuitry means;
   a 3rd switch connected to a second input line of the tristable multivibrator and the one of three signal selector means, said 3rd switch allowing transmission of a high signal to the second input line when it is on, and vice-versa, said 3rd switch turning on and off in response to appropriate signals from the one of three signal selector means;
   a 4th switch connected to the second input line of the tristable multivibrator, the one of three signal selector means, the 1st switch and the 3rd switch, said 4th switch allowing transmission of a low signal to the second input line when it is on, and vice-versa, said 4th switch turning on and off in response to appropriate signals from the one of three signal selector means;
   a 5th switch connected to a third input line of the tristable multivibrator, the one of three signal selector means, the 2nd switch, and the reset circuitry means, said 5th switch allowing transmission of a high signal to the third input line when said 5th switch is on, and vice-versa, said 5th switch turning on and off in response to appropriate signals from the one of three signal selector means or the reset circuitry means;
   and a 6th switch connected to the third input line of the tristable multivibrator, the one of three signal selector means, the 3rd switch, and the 5th switch, said 6th switch allowing transmission of a low signal to the third input line when it is on, and vice-versa, said 6th switch turning on and off in response to appropriate signals from the one of three signal selector means.

15. A ternary counter comprising:
   at least one ternary data register having clock, reset, and data inputs and also having X, Y, and Z outputs, the X output transmitting a signal present at the data input when the ternary data register received that signal, the Y output transmitting a signal corresponding to the signal at the X output increased by a digital value, and the Z output transmitting a signal corresponding to the signal at the X output decreased by a digital value;
   a count input line connected to the clock input of a first ternary data register for transmission thereto of counting signals;
   a clear input line connected to reset inputs of ternary data registers comprising the ternary counter so that the ternary counter can be placed in a known output state; and
   an output connection connecting a ternary data register output to the data input of that same ternary data register.

16. The ternary counter as set forth in claim 15, wherein the output connection connects the Y output to the data input of the same ternary data register in order to construct a ternary up-counter.

17. The ternary counter as set forth in claim 16, further comprising plural ternary data registers connected in series with the X output of a preceding ternary data register connected to the clock input of a following ternary data register in order to construct a multiple stage ternary up-counter.

18. The ternary counter as set forth in claim 15, wherein the output connection connects the Z output to the data input of the same ternary data register in order to construct a ternary down-counter.

19. The ternary counter as set forth in claim 18, further comprising plural ternary data registers connected in series with the Y output of a preceding ternary data register connected to the clock input of a following ternary data register in order to construct a multiple stage ternary down-counter.

* * * * *

UNITED STATES PATENT AND TRADEMARK OFFICE
CERTIFICATE OF CORRECTION

PATENT NO. : 4,990,796

DATED : February 5, 1991

INVENTOR(S) : Edgar Danny Olson

It is certified that error appears in the above-identified patent and that said Letters Patent is hereby corrected as shown below:

Column 7, line 48, "guad-state" should be --quad-state--.

Column 7, lines 55-57 (claim 1, lines 1-3), should be deleted.

Signed and Sealed this

Fourteenth Day of July, 1992

*Attest:*

DOUGLAS B. COMER

*Attesting Officer*      Acting Commissioner of Patents and Trademarks